(12) United States Patent
Willemin et al.

(10) Patent No.: US 7,957,448 B2
(45) Date of Patent: Jun. 7, 2011

(54) OPTOELECTRONIC CIRCUIT WITH A PHOTORECEPTOR AND A LASER DIODE, AND MODULE COMPRISING THE SAME

(75) Inventors: Michel Willemin, Prêles (CH); André Grandjean, Cressier (CH); Victorio Quercia, Vallamand (CH); Abdul-Hamid Kayal, Neuchâtel (CH); Steve Tanner, Essert-Pittet (CH)

(73) Assignee: EM Microelectronic-Marin S.A., Marin (CH)

( * ) Notice: Subject to any disclaimer, the term of this patent is extended or adjusted under 35 U.S.C. 154(b) by 136 days.

(21) Appl. No.: 12/193,248

(22) Filed: Aug. 18, 2008

(65) Prior Publication Data
US 2009/0059989 A1  Mar. 5, 2009

(30) Foreign Application Priority Data
Aug. 31, 2007  (EP) .................................... 07115378

(51) Int. Cl.
*H01S 5/00* (2006.01)
(52) U.S. Cl. ................. 372/50.21; 372/50.124; 372/50.1
(58) Field of Classification Search ................ 372/50.21, 372/50.124, 50.1
See application file for complete search history.

(56) References Cited

U.S. PATENT DOCUMENTS

| | | | |
|---|---|---|---|
| 5,978,401 A | 11/1999 | Morgan | |
| 6,073,851 A * | 6/2000 | Olmstead et al. | 235/462.45 |
| 6,567,435 B1 | 5/2003 | Scott et al. | |
| 6,794,214 B2 * | 9/2004 | Berezin et al. | 438/57 |
| 2002/0071459 A1 | 6/2002 | Malone et al. | |
| 2003/0170965 A1 * | 9/2003 | Kondo | 438/455 |
| 2006/0256194 A1 | 11/2006 | Viellerobe et al. | |

FOREIGN PATENT DOCUMENTS

| | | |
|---|---|---|
| EP | 1 324 396 A1 | 7/2003 |
| FR | 2 849 215 A1 | 6/2004 |
| GB | 2 300 301 A | 10/1996 |
| WO | 2006/042072 A2 | 4/2006 |

OTHER PUBLICATIONS

European Search Report issued in corresponding application No. EP 07 11 5378, completed Jan. 30, 2008.

* cited by examiner

*Primary Examiner* — Kinam Park
(74) *Attorney, Agent, or Firm* — Griffin & Szipl, P.C.

(57) ABSTRACT

The optoelectronic circuit includes a photoreceptor (1) made in a silicon semiconductor substrate (4), and a monomode VCSEL laser diode (2) made in a gallium arsenide substrate. The photoreceptor includes at least one photosensitive area with a pixel array for picking up light and an area with a control and processing unit for the signals supplied by the pixels. The laser diode is mounted and electrically connected directly on one part of the photoreceptor. The laser diode is connected by a conductive terminal (12) to a first contact pad (3) at the bottom of a cavity (13) made through a passivation layer (5) of the photoreceptor. An electrode (17) on the top of the diode is connected by a metal wire (15) to a second contact pad (3) of the photoreceptor. The photoreceptor controls the diode directly via the electrode and the conductive terminal to generate a laser beam (L).

17 Claims, 5 Drawing Sheets

OPTOELECTRONIC CIRCUIT WITH A PHOTORECEPTOR AND A LASER DIODE, AND MODULE COMPRISING THE SAME

This application claims priority from European Patent Application No. 07115378.7 filed Aug. 31, 2007, the entire disclosure of which is incorporated herein by reference.

FIELD OF THE INVENTION

The invention concerns an optoelectronic circuit that includes at least one photoreceptor and a laser diode. The photoreceptor is made in a first semiconductor material, and includes at least one photosensitive area with a pixel array for picking up light. The laser diode is however made in a second semiconductor material, which is different from the first semiconductor material.

The invention also concerns an optoelectronic module including the optoelectronic circuit.

BACKGROUND OF THE INVENTION

An optoelectronic circuit, mounted on a printed circuit board to form an optoelectronic module, can be used in a small instrument, such as a wireless optical computer mouse or a pointing device or any other small instrument. For an application in a conventional RF wireless optical mouse, the light source used can be a light emitting diode. This LED diode must be placed on the printed circuit board at a certain distance from the photoreceptor in order to be able to emit a light beam at a certain angle relative to the work surface on which the optical mouse is placed. The light beam from the LED diode must thus be sufficiently low angled to be able to work with the work surface speckle and to reflect part of the light in the direction of the photoreceptor to detect a movement of the mouse.

Since the LED diode has to be mounted at a location on the printed circuit board that is sufficiently far from the location of the photoreceptor and the photosensitive area thereof, for example at a distance of the order of 10 mm, the optoelectronic module comprising said photoreceptor with its photosensitive area cannot be miniaturised beyond a certain limit. Moreover, a transparent unit with at least one lens must be provided on the diode for light transmission and on the photoreceptor for light reception. This thus makes the optoelectronic module relatively voluminous. If this diode and the photoreceptor are mounted on a flexible printed circuit board, certain parts must be further rigidified to prevent any shift between the light beam emitted by the diode and the reception part of the photoreceptor.

It should also be noted that if the LED diode generates a relatively low angled light beam, a large part of the light produced by the LED diode is wasted. Consequently, a lot of electrical and luminous energy is also wasted with significant noise. Moreover, with a conventional optoelectronic module for a wireless optical mouse, there is great sensitivity to the type of surfaces on which the optical mouse is placed, which is a drawback. It is preferable therefore to be able to work on a so-called Lambert surface for good light reception. Even with all the improvements that could be made, the electrical energy consumption remains relatively high, which can be detrimental to the lifetime of the two operating battery cells of this type of mouse.

In order to avoid the problems encountered with the use of an LED diode, one could imagine using a laser diode as for this invention. With a laser diode, it is possible to take advantage of the coherence of the laser beam that is emitted and reflected onto the work surface. The beam is no longer required to incline steeply in order to detect the movement of the optical mouse. Depending upon the path of the laser beam prior to reflection onto the work surface, there may be constructive or destructive interference between the emitted and reflected laser beam. This allows the optical mouse movement to be detected given that the depth of the work surface speckles may be greater than half of the wavelength of the emitted laser beam.

Thus, the laser diode and the photoreceptor of the optoelectronic circuit could be mounted on a printed circuit board and encapsulated in a single compact case of the optoelectronic module as shown in WO Patent Application No. 2006/042072. Generally, one aperture is provided in the module for emitting light towards the exterior and one aperture for receiving the light reflected in particular onto a surface. A lens unit for directing the emitted and received light is fixed onto the apertures of the module. This transparent unit blocks the apertures in order also to protect the laser diode and the photoreceptor from dust and environmental conditions.

Even when the laser diode and photoreceptor of the optoelectronic circuit are arranged in a single case of a conventional compact module, the dimensions of the module with the optoelectronic circuit cannot be reduced sufficiently. This constitutes a drawback for the various known modules with an optoelectronic circuit. Moreover, the production costs of such optoelectronic circuits and the resulting optoelectronic modules cannot be greatly reduced.

SUMMARY OF THE INVENTION

It is thus an object of the invention to provide an optoelectronic circuit having at least one photoreceptor and one laser diode, which can overcome the aforementioned drawbacks of the state of the art and reduces the size and production costs of said circuit.

The invention therefore concerns the aforecited optoelectronic circuit, which includes the features defined in claim 1.

One advantage of the optoelectronic circuit lies in the fact that with the combination of the laser diode on the photoreceptor, a single compact component is achieved. The laser diode is both secured to one part of the photoreceptor and electrically connected to conductive paths or pads of the photoreceptor. Thus, it is possible to reduce the manufacturing costs of the optoelectronic circuit and a finished module containing the same. It is also possible to supply each optoelectronic circuit, which includes the photoreceptor and the laser diode, either on a wafer prior to the sawing operation, or by unit after the wafer has been sawed. The optoelectronic circuit obtained thus offers a superior performances in terms of movement detection precision and robustness on any type of work surface.

The laser diode used is advantageously a VCSEL type laser diode, preferably monomode. This type of laser diode sends a narrow laser beam of conical shape in a substantially vertical direction relative to the arrangement of the semiconductor layers of which it is formed, and relative to the surface of the photoreceptor receiving the laser diode. The semiconductor material of this type of VCSEL diode is for example of gallium arsenide (GaAs), whereas the semiconductor material of the photoreceptor is preferably silicon.

Owing to the use of a monomode VCSEL laser diode on the photoreceptor, it is possible for the optoelectronic circuit to provide an improved and more robust performances compared to a circuit of the state of the art. The efficiency of this laser diode in generating light is higher than a conventional LED diode. The same is true of the power efficiency thereof.

For use in a wireless optical mouse for example, the optoelectronic circuit of this invention allows detection of movement or of any action on any type of surfaces via the coherent nature of the light emitted by the VCSEL diode. With this type of laser diode, the laser beam is emitted substantially perpendicularly to a work surface, which enables work even on non-Lambert surfaces. Moreover, because of the efficiency of the laser diode, it is possible to have longer battery autonomy. A single battery cell with a lifetime of at least one year may be used. This also enables the space available for example in an optical mouse, and the costs, to be reduced. Electric energy consumption is greatly reduced with this laser diode, for example if it is powered in a small cyclical ratio while being allowed reduced illumination by a shorter optical path than with a conventional LED diode.

Since the VCSEL laser diode is of much smaller dimensions than the photoreceptor, the diode can advantageously be mounted in a cavity made through the passivation layer of the photoreceptor. The length and width of this cavity are preferably equal to those of the laser diode, which facilitates positioning of the diode when it is mounted on the photoreceptor. Moreover, the reception cavity for the laser diode gives direct access to a metal contact pad of the photoreceptor for the electrical connection of one terminal of the laser diode. This is provided without additional steps in the method for making the photoreceptor.

In order to do this, a first conductive pad on the back of the laser diode can be secured to the corresponding metal contact pad in the photoreceptor cavity. A second conductive pad or electrode on the top of the laser diode can be connected by a metal wire to another metal contact pad of the photoreceptor accessible from the exterior. The metal connecting wire of the diode is preferably a gold wire for reasons of fragility of the VCSEL diode material. The total thickness of the optoelectronic circuit combining the photoreceptor and the laser diode is thus relatively small.

The cavity for receiving the laser diode on the photoreceptor can advantageously be made at the centre of the pixel array in the photosensitive area of the photoreceptor. This allows optical splitting of a single lens unit. The unit may be mounted on at least one photosensitive area of the photoreceptor for the design of a compact optoelectronic module. Of course, this cavity may be arranged in a control and processing unit area of the photoreceptor adjacent to the photosensitive area, but not in a pick-up zone of the finished optoelectronic circuit.

The VCSEL laser diode may also be connected using two metal contact pads on the back of the diode on two corresponding metal bumps or several bumps made on the photoreceptor contact pads. This type of assembly is achieved using flip chip technology. However, with this type of connection, it is more difficult to guarantee as good positioning and orientation of the laser diode on the photoreceptor as with a reception cavity made in the passivation layer. The laser diode fixed onto the photoreceptor should, in principle, not be inclined.

It is also an object of the invention to provide an optoelectronic module including the optoelectronic circuit and capable of overcoming the aforementioned drawbacks of the state of the art in order to reduce the size of the finished module and production costs thereof.

The invention therefore also concerns an optoelectronic module of the aforecited type which includes the features defined in claim 15.

One advantage of the optoelectronic module lies in the fact that it can only use a single lens unit both for the laser diode and for at least one pixel array in the photosensitive area of the photoreceptor. This allows optical splitting both for the emission of the laser beam towards the exterior of the module and for receiving the light reflected onto a work surface, originating from the laser beam.

BRIEF DESCRIPTION OF THE DRAWINGS

The objects, advantages and features of the optoelectronic circuit and the optoelectronic module comprising the same will appear more clearly in the following description of non limiting examples illustrated by the drawings, in which.

DETAILED DESCRIPTION OF THE INVENTION

In the following description, all of the parts of the optoelectronic circuit and the module comprising the same, which are well known to those skilled in this technical field, are related only in a simplified manner.

Figure 1A:
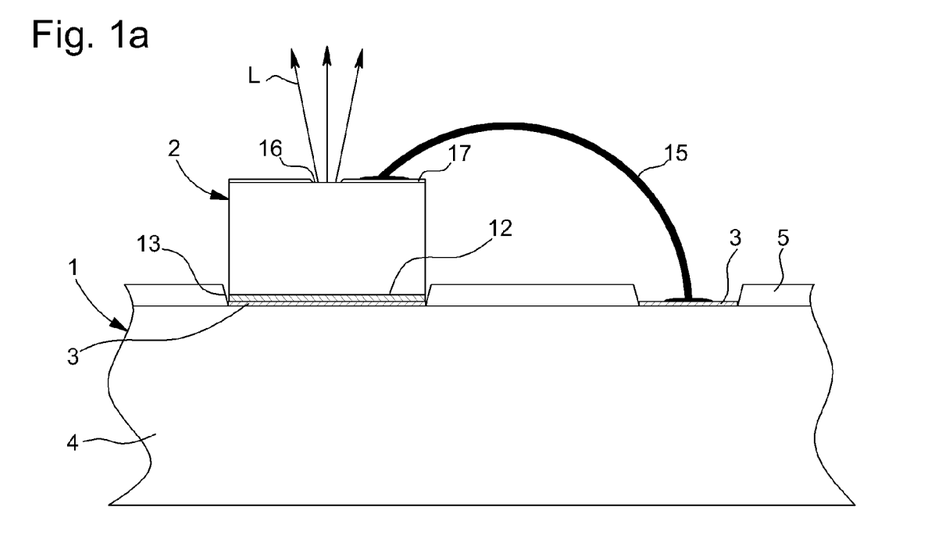
FIGS. 1a and 1b show a partial vertical cross-section view of two ways of connecting the laser diode onto the photoreceptor of the optoelectronic circuit according to the invention, on the one hand in a cavity of the photoreceptor, and on the other hand via flip chip technology.
Figure 1B:
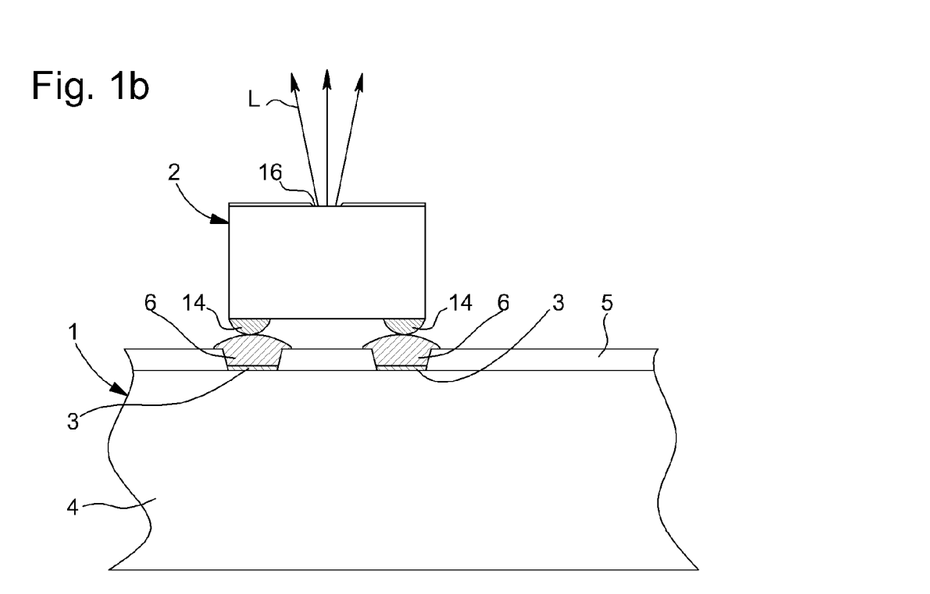

In FIGS. 1a and 1b, the optoelectronic circuit includes a photoreceptor 1 on which a laser diode 2 is mounted and electrically connected. Photoreceptor 1 is made in a first material, which is a silicon semiconductor substrate 4, whereas laser diode 2 is made in a second material, which is preferably a gallium arsenide semiconductor substrate (GaAs).

Laser diode 2 may be a monomode VCSEL (vertical cavity surface emitting laser) laser diode. This type of diode 2 is made in a known manner by the juxtaposition of doped gallium arsenide layers and AlGa or AlAs or InGaAs layers. Light is generated in an active zone at the centre of the diode, and the laser beam generated exits through an aperture 16 at the centre of an electrode 17 made on a top surface. Laser beam L exits in the form of a narrow cone through aperture 16 and substantially vertically relative to the arrangement of the semiconductor layers forming said diode and to the surface of the photoreceptor receiving the diode.

The VCSEL laser diode is a very small element that is often difficult to handle. The dimensions of its length and width may be of the order of 200 μm×200 μm or slightly greater, and its thickness may be of the order of 150 μm. Consequently, given its very small dimensions, one could envisage mounting and electrically connecting this laser diode 2 on one part of photoreceptor 1 so as to be able to form an optoelectronic circuit according to the invention in the form of a single component.

In FIG. 1a, laser diode 2 may be mounted in a cavity 13 made in the passivation layer 5 obtained at the end of the manufacturing process of photoreceptor 1. The thickness of this passivation layer 5 may be of the order of 1 μm, which is obviously not illustrated accurately in the drawings in order to make the drawings clear. Moreover, several apertures are made in passivation layer 5 to give normal access to metal contact pads 3 of the photoreceptor. These contact pads 3 are usually connected by a metal wire to the conductive pads of a printed circuit board or support on which the photoreceptor is mounted. The width of each contact pad may be 100 μm, whereas the space between each pad may for example be 200 μm.

The VCSEL laser diode 2 may comprise a conductive or metal pad 12 on the back, which could for example cover the entire bottom surface of said laser diode. This metal pad 12 is connected directly onto a metal pad 3 of the photoreceptor through the aperture of cavity 13 made in the passivation layer 5 to define, for example, an earth terminal of the diode. This metal pad 3 at the bottom of the cavity could also be formed of several metal portions slightly spaced apart from each other to facilitate the securing of the diode in the cavity. The electrical connection between metal pad 12 and metal pad 3 of photoreceptor 1 could be achieved by ultrasound, by soldering the two pads one on top of the other, or via a layer of conductive adhesive that is not shown.

The aperture of cavity 13 is dimensioned as a function of the size of said laser diode, i.e. slightly greater than the width and length of said laser diode so as to facilitate the mounting of the diode in the cavity and the electrical connection thereof. Consequently, the accessible metal pad 3 of photoreceptor 1 for receiving laser diode 2 must be at least slightly greater than 200 μm×200 μm, which may be the size of said diode.

Once mounted and electrically connected in cavity 13 of passivation layer 5 of photoreceptor 1, an electrode 17, which is made on the top surface of laser diode 2, can be connected by metal wire 15 to another contact pad 3 provided for such purpose in photoreceptor 1. This metal wire is preferably a gold wire given the fragility of the material that forms the VCSEL laser diode. This electrode 17 defines, for example, a high potential terminal of the laser diode. In this way, a supply voltage can be applied between electrode 17 and earth terminal 12 of the diode to generate laser beam L exiting via aperture 16 through electrode 17. This supply voltage is supplied for example by a signal control and processing unit of the photoreceptor, which thus controls the laser diode.

In FIG. 1b, laser diode 2 can be mounted on photoreceptor 1 via a flip chip technique. In order to do this, laser diode 2 may include at least two metal pads or bumps 14 on the back to define the earth terminal and the high potential terminal. Photoreceptor 1 may include metal bumps 6 made on contact pads 3. Metal bumps 6 for connecting laser diode 2 may be closer together than the space necessary between two conventional contact pads 3 of photoreceptor 1.

Contact pads 3 of photoreceptor 1 are made in a conventional manner on semiconductor substrate 4. Apertures in the final passivation layer 5 deposited on substrate 4 are first of all provided to provide access to each contact pad 3. The metal bumps 6 are made afterwards through the apertures in passivation layer 5 from each contact pad 3 so as to project from the top surface of said passivation layer. The metal bumps 14 of laser diode 2 are then positioned above two metal bumps 6 of the photoreceptor provided for receiving said diode. Laser diode 2 can be fixed onto photoreceptor 1 via metal contact bumps 6, 14 by thermocompression or by ultrasound.

Of course, laser diode 2, the back of which may include two or four metal bumps 14 for the stable holding and electrical connection thereof to the photoreceptor, may also be positioned in a cavity made for this purpose in passivation layer 5 as indicated with reference to FIG. 1a. In such case, at least two separate contact pads 3 must be provided, accessible at the bottom of cavity 13. This avoids having to use a metal wire to connect one terminal of the diode to another contact pad 3 of the photoreceptor. Moreover, the VCSEL laser diode 2, in the cavity of passivation layer 5, which is dimensioned to receive the diode, is in part protected when the finished optoelectronic circuit is being handled. The thickness of the optoelectronic circuit in this case is sufficiently reduced.

Figure 2:
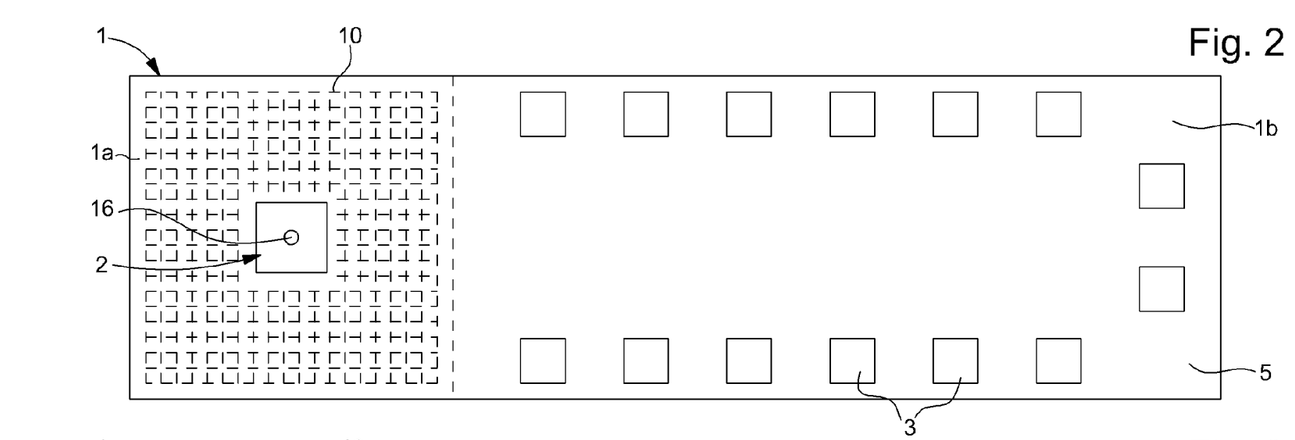
FIG. 2 shows a top view of a first embodiment of the optoelectronic circuit according to the invention.

A first embodiment of the optoelectronic circuit is shown in FIG. 2. In FIG. 2, VCSEL laser diode 2 is shown in a top view connected to photoreceptor 1 in accordance with the second way explained with reference to FIG. 1b by the flip chip technique. Laser diode 2 is preferably placed at the centre of a pixel array 10 of one photosensitive area 1a of the photoreceptor. Aperture 16 of the diode light passage is placed at the centre of the electrode made on the top surface of laser diode 2.

Two metal paths that are not shown on photoreceptor 1 connect the two metal bumps of the photoreceptor to the area of control and processing unit 1b. The two metal bumps on the back of laser diode 2 are secured to the two corresponding bumps made at the centre of the pixel array. This means that only a single lens unit has to be used for optical splitting when the optoelectronic circuit is mounted in a module.

Photoreceptor 1 in this first embodiment therefore includes one photosensitive area 1a and an adjacent area 1b, which includes a signal control and processing unit for processing the electrical signals supplied by the pixels of the photosensitive area. Each pixel of the array, shown schematically as a square, supplies a signal to the processing unit as a function of the light picked up originating from a reflection of the laser beam, generated by the laser diode, on a work surface. This array may include 15×15 pixels to 30×30 pixels for a pixel width comprised between 10 and 40 μm. However, given the location of the laser diode at the centre of this array, there is one portion of pixels of the array that is not made. The dimension of the total surface of the photoreceptor with the two areas 1a and 1b may be smaller than 3 mm$^2$ for example of the order of 2 mm$^2$.

In this first embodiment, all of the contact pads 3 of the photoreceptor are arranged solely in the control and processing unit area 1b, leaving photosensitive area 1a free. Photosensitive area 1a is juxtaposed with one side of the control and processing unit area to define two distinct areas in the same semiconductor substrate, made for example of silicon. Of course, if laser diode 2 is connected to photoreceptor 1 by the flip chip technique, metal bumps that are not shown may be made on the contact pads 3 of the photoreceptor. These metal bumps project slightly from the top surface of passivation layer 5.

Contact pads 3 are preferably distributed symmetrically in the area of control and processing unit 1b. These contact pads are arranged for example in two peripheral rows, lengthways on the two juxtaposed areas. An equal number of contact pads to be electrically connected, which are regularly or symmetrically spaced apart from each other, may be provided in each row. Two or more contact pads 3 may be provided on one side of the control and processing unit area 1b opposite photosensitive area 1a.

The symmetrical distribution of contact pads 3 with metal bumps may be necessary to ensure reliable assembly of the finished optoelectronic circuit on a printed circuit board or support by the flip chip technique. Thus, during assembly, no force is applied on the photosensitive area side, which may protect the latter from any mechanical stress.

Figure 3:
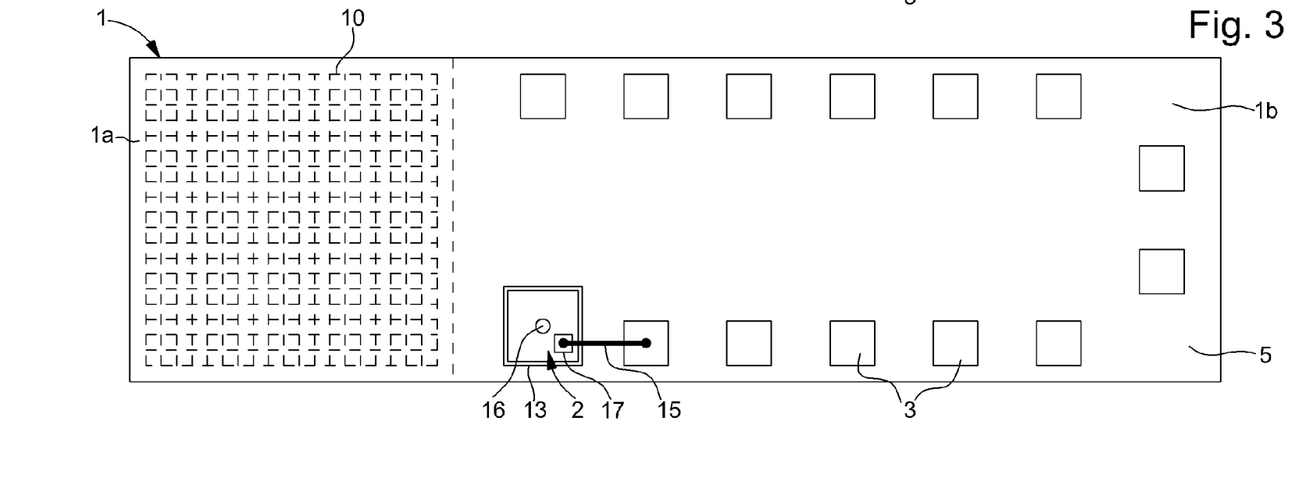
FIG. 3 shows a top view of a second embodiment of the optoelectronic circuit according to the invention.

A second embodiment of the optoelectronic circuit is shown in FIG. 3. In FIG. 3, the VCSEL laser diode 2 is shown in a top view connected to photoreceptor 1 in the first way explained with reference to FIG. 1a. VCSEL laser diode 2 is housed and electrically connected in a cavity 13 made in passivation layer 5. A metal wire 15 connects the high potential terminal formed by electrode 17 of the diode to another adjacent contact pad 3 of photoreceptor 1.

Preferably, the laser diode is positioned in control and processing unit area 1b in proximity to photosensitive area 1a so that only one optical lens unit has to be used for assembly in a module. Moreover, the location of the diode must be sufficiently removed from the pick-up zone of the optoelectronic circuit.

Figure 4:
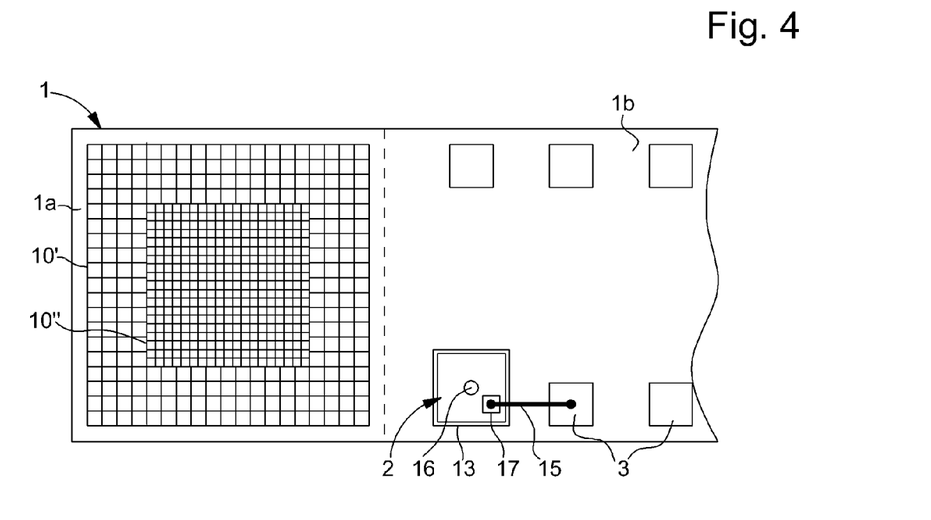
FIG. 4 shows a partial top view of the second embodiment shown in FIG. 3, with one photosensitive area of the photoreceptor formed of two pixel arrays arranged one at the centre of the other.

FIG. 4 shows schematically photosensitive area 1a of photoreceptor 1 and the connection of the laser diode in accordance with the first manner described with reference to FIG. 1a.

This photosensitive area 1a includes two pixel arrays 10' and 10", which are arranged one at the centre of the other. The first pixel array 10" arranged at the centre is composed of finer pixels, whereas the second pixel array 10' surrounding the first pixel array is composed of larger pixels. Because of this structure, which is like that of the human eye, the pixels of the first array 10' are used for the coherent detection of surface speckles, since they are more precise, but incapable of detecting large amplitude movements. The pixels of the second array 10' are used for detecting extreme movements, since they are quicker and compatible with large amplitude movements, but less precise.

Figure 5:
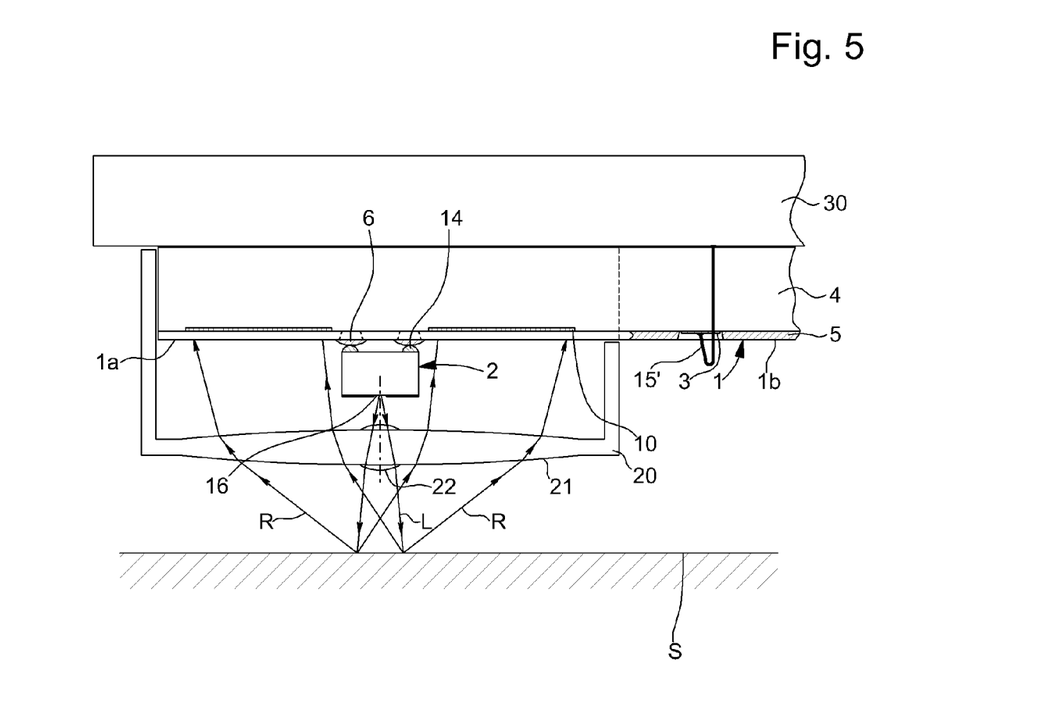
FIG. 5 shows a partial vertical cross-section view of a first optoelectronic module including an optoelectronic circuit according to the invention in part according to the first embodiment of FIG. 2.

FIG. 5 shows partially a first optoelectronic module including an optoelectronic circuit according to the invention. This optoelectronic module may be fitted for example to a small instrument, such as a wireless optical computer mouse. The optoelectronic circuit used to make this first module is based in part on the first embodiment of FIG. 2. Laser diode 2 is secured via its two metal bumps 14 to the two corresponding metal bumps 6 of photoreceptor 1 at the centre of the pixel array 10 of photosensitive area 1a.

Substrate 4 of photoreceptor 1 of the optoelectronic circuit is mounted on a printed circuit board or support 30, which may be rigid or flexible. The control and processing unit area 1b includes the set of contact pads 3 which can be connected for example by a metal aluminium wire 15' to each corresponding conductive pad of the printed circuit. An opaque case or encapsulation resin, not shown, could be placed on this area 1b to protect it, particularly from light.

Of course, one could also have envisaged making metal bumps 6, not shown, on the contact pads of area 1b. This would enable the optoelectronic circuit to be directly connected onto corresponding conductive paths of the printed circuit, which are arranged in a similar way to the metal bumps. In such case, a through aperture (not shown) would have to be provided in printed circuit board or support 30 above photosensitive area 1a of the optoelectronic circuit.

The optoelectronic module also includes a single lens unit 20, which is mounted on photosensitive area 1a of the optoelectronic circuit. This optical splitting lens unit includes, in a central position, a first, for example aspherical, lens 22 for guiding laser beam L exiting aperture 16 of laser diode 2 in the direction of a work surface S. A second, for example aspherical, lens 21 centred on the first lens covers the pixel array 10 of photosensitive area 1a so as to redirect the light R reflected by work surface S towards the pixels of the array.

Since the laser diode is arranged at the centre of array 10, the emitted laser beam L and the light R reflected on work surface S travel a very short path. Because of this and the coherence of the emitted laser beam generated, the laser diode can be powered in a small cyclical ratio while producing a reduced illuminated zone. This reduces the electric energy consumption of the module to increase the lifetime of the cell battery of the mouse.

Figure 6:
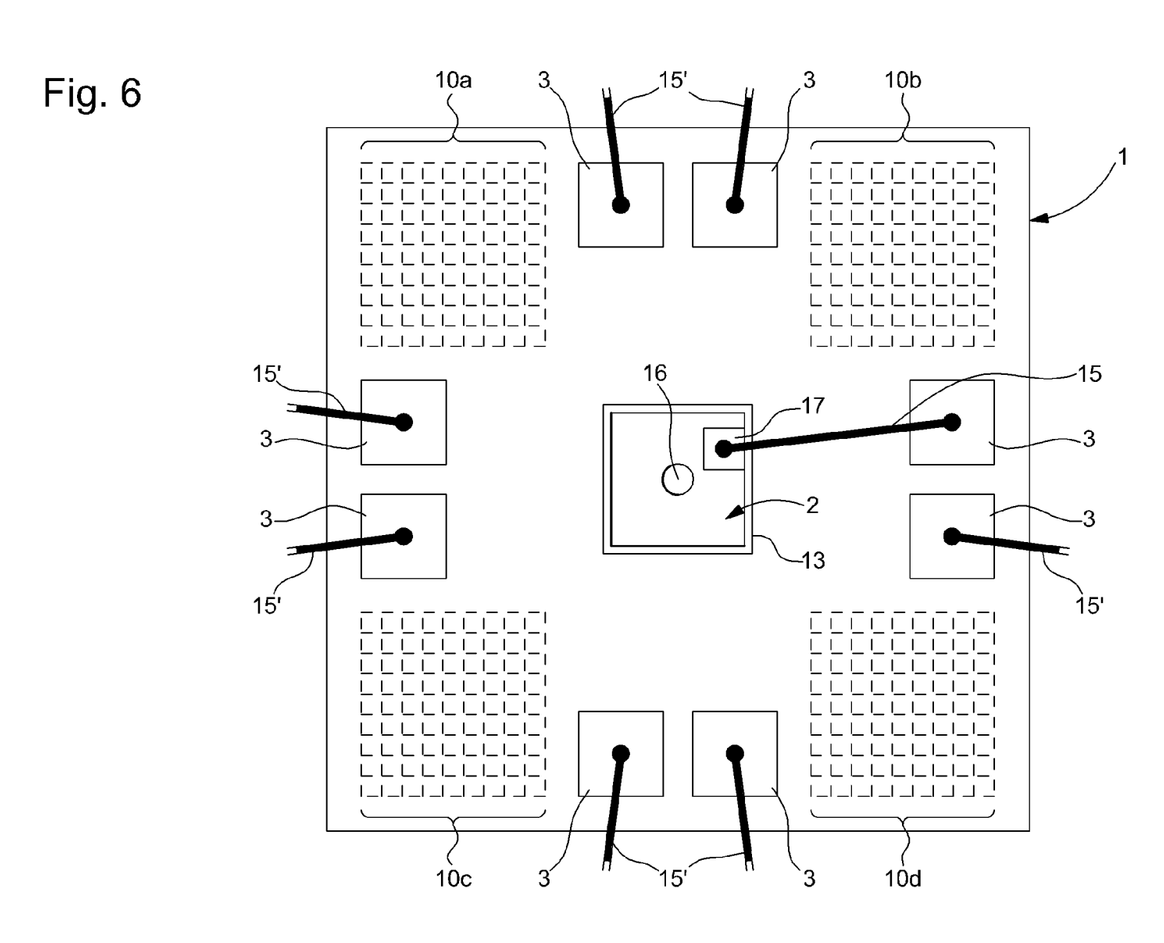
FIG. 6 shows a top view of a third embodiment of the optoelectronic circuit according to the invention.

A third embodiment of the optoelectronic circuit is shown in FIG. 6. This optoelectronic circuit includes a photoreceptor 1 of substantially square shape seen from above, and a laser diode 2 shown at the centre on photoreceptor 1. The VCSEL laser diode 2 is positioned on and electrically connected to a contact pad in a central cavity 13 made through the passivation layer of the photoreceptor as explained above with reference to FIG. 1a.

The central cavity 13 is made in the same step of the manufacturing method of photoreceptor 1 as the apertures that give access to metal contact pads 3. These contact pads 3 arranged at the periphery of the photoreceptor can be connected by a metal aluminium wire 15' to corresponding pads on a printed circuit board that is not shown. Electrode 17 on the top surface of laser diode 2 is connected to one of contact pads 3 of the photoreceptor by means of a gold wire 15. In this manner, the laser diode can be powered via the photoreceptor to generate the laser beam exiting through central aperture 16 in electrode 17.

Photoreceptor 1 includes, in this third embodiment, several photosensitive areas formed by 4 pixel arrays 10a, 10b, 10c, 10d of equal dimensions. Each array, arranged in each corner of photoreceptor 1, may include for example 16×16 pixels. The arrangement of these pixel arrays and contact pads 3 may be totally symmetrical with two contact pads between two arrays of each side of photoreceptor 1. The dimensions of the width and length of photoreceptor 1 may be, for example, of the order of 1.8 mm by 1.8 mm.

This photoreceptor 1 may include between each array at least one area with a unit for the control and processing of the signals supplied by the pixels. However, it is also conceivable that photoreceptor 1 includes only photosensitive areas and one portion for receiving laser diode 2. In such case, the laser diode must be controlled by an external unit via photoreceptor 1.

Of course, one could also envisage the 4 pixel arrays each having different dimensions or two similar arrays differing from two other similar arrays. The size of the pixels of the arrays could also be similar or different from one array to another.

Figure 7:
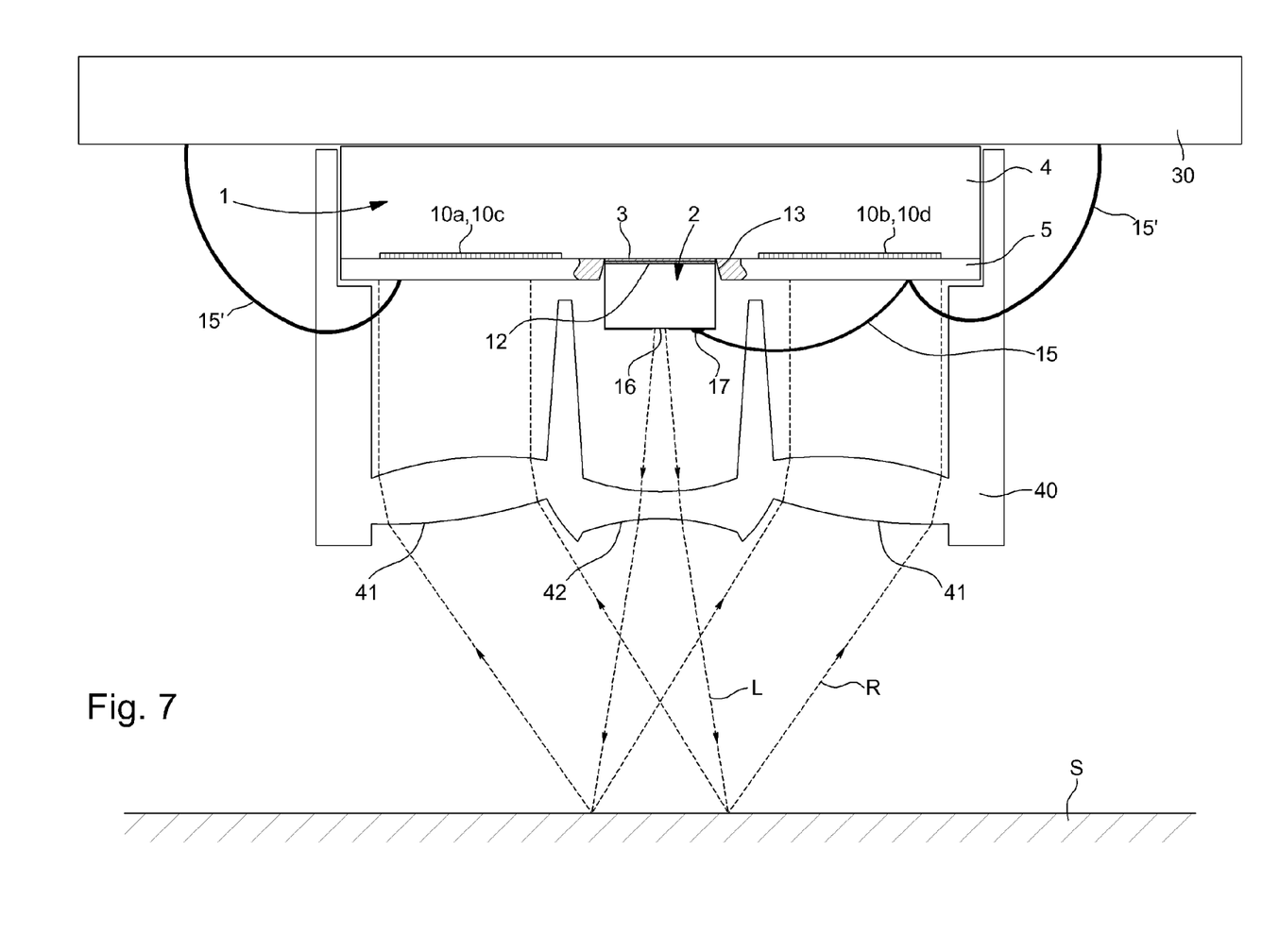
FIG. 7 shows a partial vertical cross-section view of a second optoelectronic module including an optoelectronic circuit of the invention in accordance with the third embodiment of FIG. 6.

The optoelectronic circuit of this third embodiment shown in FIG. 6 can be mounted in an optoelectronic module as shown in a simplified manner in a partial vertical cross-section view in FIG. 7.

The back of substrate 4 of photoreceptor 1 is secured to a printed circuit board or support 30. Some of the photoreceptor contact pads accessible through passivation layer 5 and arranged at the periphery of the photoreceptor can each be connected by a metal aluminium wire 15' to corresponding conductive pads of printed circuit board 30. Photoreceptor 1 further includes 4 pixel arrays 10a, 10b, 10c, 10d, shown in a simplified manner and arranged in each corner.

An earth terminal 12 on the back of VCSEL laser diode 2 is connected in central cavity 13 to a contact pad 3 of the photoreceptor provided for this purpose. Electrode 17 on the top surface of the diode is connected by a gold metal wire 15 to one of the control contact pads of the photoreceptor.

The optoelectronic module further includes a single lens unit 40, which is arranged on the photoreceptor to cover the latter completely. This lens unit 40 may rest on or be secured to the printed circuit board 30 while leaving apertures for the passage of the metal wires 15' connecting the photoreceptor to the printed circuit board. If at least one control and processing unit area is provided in photoreceptor 1, this area has to be covered by an opaque cover (not shown) or be coated with a conventional encapsulation resin.

This lens unit 40 includes a central lens 42 provided for directing laser beam L generated by laser diode 2 in the direction of work surface S. The lens unit further includes 4 peripheral lenses 41 each arranged respectively above a pixel array 10a, 10b, 10c, 10d so as to redirect the light R reflected on the work surface onto the pixels of each array.

Owing to the arrangement of the elements of the optoelectronic circuit and the module comprising the same, the minimum optical distance is thus optimised. A narrow, low intensity laser spot or beam can be generated by the laser diode while guaranteeing a maximum field for collecting the light by all of the pixel arrays with several fields of vision. With a single optical unit, the optoelectronic module can be mounted with optimum assembly tolerances. The minimum distance from the laser diode to the work surface S can be reduced to a distance of the order of 1.8 mm for example.

From the description that has just been given, several variants of the optoelectronic circuit and the module comprising the same can be devised by those skilled in the art without departing from the scope of the invention defined by the claims. One could envisage mounting several VCSEL laser diodes on the photoreceptor, which may be monomode or multimode. A laser diode of a different type may also be arranged for direct assembly on one portion of the photoreceptor. The photoreceptor may include several pixel arrays of similar or different size for detecting several categories of movement. An arrangement of micro-manufactured optical filters could also be provided for the optoelectronic module in order to decrease the size of the photoreceptor.

What is claimed is:

1. An optoelectronic circuit including:
   (a) a photoreceptor made in a first semiconductor material that is a silicon substrate, wherein the photoreceptor includes at least one photosensitive area with a pixel array arranged to pick up light; and
   (b) a laser diode made in a second semiconductor material, different from the first semiconductor material,
   wherein one part of the laser diode is disposed in a cavity, made through a passivation layer on one part of the photoreceptor, so that the laser diode is mounted in the cavity, and the one part of the laser diode is also electrically connected, in the cavity, directly to the one part of the photoreceptor, and
   wherein when the laser diode is mounted in the cavity the cavity guides and positions the laser diode in the cavity for the direct electrical connection.

2. The optoelectronic circuit according to claim 1, wherein the laser diode is a monomode VCSEL laser diode supplying a laser beam in a substantially perpendicular direction to the surface of the photoreceptor on which said diode is mounted, and wherein the second semiconductor material of the VCSEL laser diode is formed of gallium arsenide.

3. The optoelectronic circuit according to claim 1, wherein at least one accessible first metal contact pad of the photoreceptor is arranged at the bottom of the cavity for electrical connection to at least one conductive terminal on the back of the laser diode, said photoreceptor also including several other contact pads accessible from the exterior through apertures in the passivation layer.

4. The optoelectronic circuit according to claim 3, wherein the first metal contact pad in the cavity is formed of several metal portions to facilitate the securing of the conductive terminal of the diode in the cavity.

5. The optoelectronic circuit according to claim 3, wherein the VCSEL laser diode includes an electrode on a top surface at the centre of which there is provided an aperture for the passage of a laser beam generated by the laser diode, and wherein the electrode is connected by a metal wire to a second contact pad of the photoreceptor, a supply voltage being able to be provided between the electrode and the conductive terminal at the back of the diode via the photoreceptor in order to generate the laser beam.

6. The optoelectronic circuit according to claim 3, wherein the VCSEL laser diode includes at least two conductive terminals arranged on the back of the diode to be connected to two respective contact pads accessible through the cavity receiving said laser diode.

7. The optoelectronic circuit according to claim 1, wherein the photoreceptor includes at least one photosensitive area, which includes at least one pixel array, and an adjacent area with a control and processing unit for the signals supplied by the pixels of the array.

8. The optoelectronic circuit according to claim 1, wherein the laser diode is positioned and electrically connected at the centre of the pixel array.

9. The optoelectronic circuit according to claim 7, wherein the laser diode is mounted and electrically connected in the signal control and processing unit area.

10. The optoelectronic circuit according to claim 1, wherein the photosensitive area of the photoreceptor includes a first pixel array arranged at the centre of a second pixel array, and wherein the first pixel array is formed of finer pixels than the second pixel array.

11. The optoelectronic circuit according to claim 1, wherein the photoreceptor includes several pixel arrays, in particular 4 pixel arrays, and wherein the laser diode is mounted and electrically connected at the centre of the photoreceptor.

12. The optoelectronic circuit according to claim 11, wherein the 4 pixel arrays are of the same dimensions and are arranged in each corner of the photoreceptor, and wherein contact pads of the photoreceptor accessible through apertures through a passivation layer of the photoreceptor are arranged regularly at the periphery of the photoreceptor and between each pixel array.

13. The optoelectronic circuit according to claim 7, wherein all of contact pads of the photoreceptor that are accessible through apertures through a passivation layer of the photoreceptor, are arranged solely on the side of the control and processing unit area, which is juxtaposed with the photosensitive area.

14. The optoelectronic circuit according to claim 13, wherein the laser diode is mounted and electrically connected in a cavity made through a passivation layer in the control and processing unit area of the photoreceptor in proximity to the photosensitive area, the dimensions of the cavity being substantially equal to the dimensions of the diode so as to guide and position said diode onto a first metal contact pad of the photoreceptor at the bottom of the cavity, and wherein an electrode on the top surface of the diode is connected by a metal wire to a second adjacent contact pad of the photoreceptor.

15. The optoelectronic module comprising the optoelectronic circuit according to claim 1, said optoelectronic circuit being mounted on a printed circuit board or support, wherein said optoelectronic module includes a single lens unit arranged at least on the photosensitive area of the photoreceptor, the single lens unit allowing optical splitting between the laser diode and at least one pixel array.

16. The optoelectronic module according to claim 15, wherein the laser diode is mounted at the centre of at least one pixel array of the photosensitive area, and wherein a first lens of the lens unit is in a central position above the laser diode in order to guide the laser beam exiting a central aperture on the top of the laser diode, in the direction of a work surface, and wherein a second lens is centred on the first lens in order to cover the pixel array of the photosensitive area to redirect the light reflected by the work surface towards the pixels of the array.

17. An optoelectronic circuit including:
(a) a photoreceptor made in a first semiconductor material that is a silicon substrate, wherein the photoreceptor includes at least one photosensitive area with a pixel array for picking up light; and
(b) a laser diode made in a second semiconductor material, different from the first semiconductor material,
wherein one part of the laser diode is disposed in a cavity made through a passivation layer on a control and processing unit area of the photoreceptor, in proximity to the photosensitive area, so that the laser diode is mounted in the cavity, and the one part of the laser diode is also electrically connected, in the cavity, directly to the control and processing unit of the photoreceptor,
wherein the dimensions of the cavity are substantially equal to the dimensions of the diode so as to guide and position the laser diode onto a first metal contact pad of the photoreceptor at the bottom of the cavity, and
wherein an electrode on the top surface of the laser diode is connected by a metal wire to a second adjacent contact pad of the photoreceptor.

* * * * *